(12) United States Patent
Belyansky et al.

(10) Patent No.: US 7,081,393 B2
(45) Date of Patent: Jul. 25, 2006

(54) REDUCED DIELECTRIC CONSTANT SPACER MATERIALS INTEGRATION FOR HIGH SPEED LOGIC GATES

(75) Inventors: Michael P. Belyansky, Bethel, CT (US); Joyce C. Liu, Carmel, NY (US); Hsing Jen Wann, Carmel, NY (US); Richard Stephen Wise, New Windsor, NY (US); Hongwen Yan, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,652

(22) Filed: May 20, 2004

(65) Prior Publication Data

US 2005/0260819 A1    Nov. 24, 2005

(51) Int. Cl.
*H01L 21/336* (2006.01)

(52) U.S. Cl. .................. 438/305; 438/299; 438/306

(58) Field of Classification Search ............ 438/305, 438/306, 303, 301, 299, 146, 76, 592, 595
See application file for complete search history.

(56) References Cited

U.S. PATENT DOCUMENTS

| | | | | |
|---|---|---|---|---|
| 6,194,748 B1 | * | 2/2001 | Yu | 438/305 |
| 6,297,115 B1 | * | 10/2001 | Yu | 438/305 |
| 6,316,348 B1 | | 11/2001 | Fu et al. | |
| 6,342,450 B1 | | 1/2002 | Lattard | |
| 6,365,451 B1 | | 4/2002 | Havemann | |
| 6,383,951 B1 | | 5/2002 | Li | |
| 6,429,477 B1 | * | 8/2002 | Mandelman et al. | 257/301 |
| 6,528,372 B1 | | 3/2003 | Lukanc et al. | |

* cited by examiner

*Primary Examiner*—Walter L. Lindsay, Jr.
(74) *Attorney, Agent, or Firm*—Howard M. Cohn; H. Daniel Schnurmann

(57) ABSTRACT

An FET transistor has a gate disposed between a source and a drain; a gate dielectric layer disposed underneath the gate; and a spacer on a side of the gate. The gate dielectric layer is conventional oxide and the spacer has a reduced dielectric constant (k). The reduced dielectric constant (k) may be less than 3.85, or it may be less than 7.0 (~nitride), but greater than 3.85 (~oxide). Preferably, the spacer comprises a material which can be etched selectively to the gate dielectric layer. The spacer may be porous, and a thin layer is deposited on the porous spacer to prevent moisture absorption. The spacer may comprise a material selected from the group consisting of Black Diamond, Coral, TERA and Blok type materials. Pores may be formed in the spacer material by exposing the spacers to an oxygen plasma.

20 Claims, 1 Drawing Sheet

REDUCED DIELECTRIC CONSTANT SPACER MATERIALS INTEGRATION FOR HIGH SPEED LOGIC GATES

BACKGROUND OF INVENTION

The invention relates to semiconductor device fabrication, particularly to dielectric materials, and more particularly to spacers for gate electrodes.

Integrated circuits (ICs) typically comprise many complementary metal oxide semiconductor (CMOS) field effect transistors (FETs). FETs typically comprise gate structures (or, simply "gates") disposed between drain and source regions. The drain and source regions are typically located within a semiconductor film or substrate. The gates are provided on a top surface of the film or substrate, and there is a gate dielectric layer, typically oxide, underneath the gate. The drain and source regions can be heavily doped with a P-type dopant (e.g., boron) or an N-type dopant (e.g., phosphorous. Typically, a spacer isolates the gate from the metal contact with each of the diffusion (source/drain) regions of the transistor. The spacer is a dielectric material, typically oxide or nitride.

Typical sidewall spacers are formed using a conformal deposition of a spacer material over the gate structure, followed by a directional etch, as disclosed by Pogge in U.S. Pat. No. 4,256,514, "Method for Forming a Narrow Dimensioned Region on a Body," assigned to International Business Machines, Inc. The directional etch removes all the spacer material from the horizontal surfaces, but leaves "spacers" at the sidewalls of the gates. These spacers are inherently self-aligned with the gate.

Silicon dioxide ($SiO_2$, also referred to simply as "oxide") has a dielectric constant k of at least 3.85, typically 4.1–4.3, or higher. Silicon nitride ($Si_3N_4$, also referred to simply as "nitride", often abbreviated as "SiN") has a dielectric constant k of approximately 7.0. A free space (e.g., air) has a dielectric constant k of approximately 1.0. By definition, a vacuum has a dielectric constant k of 1.0.

In many spacer applications silicon nitride is typically used to provide selectivity to the contact dielectric (e.g. silicon dioxide), in spite of its higher dielectric constant.

Low-k (or "low k") dielectric materials are known, and are typically defined as materials having a dielectric constant k less than 3.85—in other words, less than oxide. Medium-k dielectric materials are also known and, as used herein, these materials have a dielectric constant k less than 7.0, or less than nitride, but greater than oxide. Collectively, low-k and medium-k materials are referred to herein as "reduced dielectric constant materials".

A variety of low-k and medium-k materials are known. They can characterized by their composition and/or by the way in which they typically are deposited.

Deposition is a process whereby a film of either electrically insulating (dielectric) or electrically conductive material is deposited on the surface of a wafer. Chemical Vapor Deposition (CVD) is used to deposit both dielectric and conductive films via a chemical reaction that occurs between various gases in a reaction chamber. Plasma enhanced Chemical Vapor Deposition (PECVD) uses an inductively coupled plasma to generate different ionic and atomic species during the deposition process. PECVD typically results in a low temperature deposition compared to the corresponding thermal CVD process. Spin-on deposition (also called "spin coating") is used to deposit materials such as photoresist. A wafer is coated with material in liquid form, then spun at speeds up to 6000 rpm, during which the liquid is uniformly distributed on the surface by centrifugal forces, followed by a low temperature bake which solidifies the material.

Low-k and Medium-k Materials

As used herein, a low-k material is a material which has a dielectric constant k less than 3.85 (less than oxide), and a medium-k material is a material which has a dielectric constant k less than 7.0 (nitride) and greater than 3.85.

Examples of spin-on low-k materials include:

BCB (divinylsiloxane bisbenzocyclobutene), sold by Dow Chemical.

SiLK™, an organic polymer with k=2.65, similar to BCB, sold by Dow Chemical.

NANOGLAS™, an inorganic porous polymer with k=2.2, sold by Honeywell.

FLARE 2.0™ dielectric, an organic low-k poly(arylene) ether available from Allied Signal, Advanced Microelectronic Materials, Sunnyvale, Calif.

inorganic materials such as spin-on glass (SOG), fluorinated silicon glass (FSG) and, particularly, methyl-doped porous silica which is referred to by practitioners of the art as black diamond, or BD. About 36% of a BD layers volume is in the form of pores having a diameter between about 8 and 24 Angstroms.

organo-silicate materials, such as JSR LKD 5109 (a spin-on material, Japan Synthetic Rubber).

organic polymers (fluorinated or non-fluorinated), inorganic polymers (nonporous), inorganic-organic hybrids, or porous materials (xerogels or aerogels).

materials in the parylene family of polymers, the polynapthalene family of polymers, or polytetrafluoroethylene.

Examples of low-k Chemical Vapor Deposition (CVD) and Plasma Enhanced CVD (PECVD) low-k materials include:

Black Diamond™, a organosilicon glass (OSG) which is a Si—O—C—N type of material, with a dielectric constant k of 2.7 to 3.0 (e.g., 2.9), sold by Applied Materials Inc. Black Diamond™ comprises about 12% carbon and about 9% nitrogen.

CORAL™, also an organosilicon glass OSG) which is a Si—O—C—H type of material, with k of 2.7–3.0, sold by Novellus Systems, Inc. CORAL™ comprises about 30% carbon.

fluorinated $SiO_2$ glass, and amorphous C:F.

Examples of medium-k CVD materials include:

FSG (fluorinated silicon glass) with k value of 3.4. Composition (Si—O—F).

TERA™, a silicon carbide (Si—C—H) type of material with k=5 developed by IBM.

Blok™, a silicon carbide (Si—C—H) type material with k=5 sold by AMAT Corp.

PorosityIt is known that pores in dielectric materials can lower the dielectric constant. Low-k and medium-k dielectric materials can typically be deposited ab initio either with or without pores, depending on process conditions. Since air has a near 1 dielectric constant, porous films exhibit reduced dielectric constants than the base material in which they are developed. Generally, it is the spin-on materials (e.g., SILK, NANOGLASS) materials that exhibit a high degree of porosity. The PECVD materials generally do not exhibit such high degree of porosity, due to the method of deposition. As a result it is very difficult to prepare a CVD film with a k value <2.5.

Examples of dielectric materials which may be formed ab-initio having pores include:

organic materials, such as porous SiLK (tm, Dow).

inorganic materials, such as nanoglass (tm, Honeywell).

organo-silicate materials, such as JSR LKD 5109 (a spin-on material, Japan Synthetic Rubber).

These materials have pores, usually (typically) ranging in size from 0.1 to 10 nanometers. The density of the pores, in other word how much of the material is pores versus the overall volume of the material, is typically approximately 20%–75% pores.

U.S. Pat. No. 6,383,951 discloses a low dielectric constant material for integrated circuit fabrication. A method is provided for forming a material with a low dielectric constant, suitable for electrical isolation in integrated circuits. The material and method of manufacture has particular use as an interlevel dielectric between metal lines in integrated circuits. In a disclosed embodiment, methylsilane is reacted with hydrogen peroxide to deposit a silicon hydroxide layer incorporating carbon. The layer is then treated by exposure to a plasma containing oxygen, and annealing the layer at a temperature of higher than about 450 degrees-C. or higher.

U.S. Pat. No. 6,194,748 ('748 patent) discloses a MOSFET with suppressed gate-edge fringing field effect. The transistor includes a low-k dielectric spacer and a high-k gate dielectric. The high-k gate dielectric can be tantalum pentaoxide or titanium dioxide. The process can be utilized for P-channel or N-channel metal oxide field semiconductor effect transistors (MOSFETs).

As shown in the '748 patent, a transistor 12 is disposed on a semiconductor substrate 14, such as, a single crystal silicon wafer. Transistor 12 is part of a portion 10 of an integrated circuit (IC) manufactured on a wafer (such as, a silicon wafer). Transistor 12 preferably has a gate length of less than 100 nanometer (nm) (e.g., approaching 50 um). The substrate 14 can be any semiconductor material, including gallium arsenide (GaAs), silicon (Si), germanium (Ge), or other material. Alternatively, substrate 14 can be a thin-film layer that is part of a silicon-on-insulator substrate. (1 micron=1e−6 meter=1000 nm=10000 Å)

Transistor 12 includes a gate stack or structure 18, a source region 22, and a drain region 24. Source region 22 and drain region 24 also include a source extension 23 and a drain extension 25, respectively. In the exemplary embodiment, source region 22 and drain region 24 have deep contact regions 17 and 19, respectively, which are 60–120 nm deep (60–120 nm below a top surface 39 of substrate 14).

Transistor 12 can be an N-channel or a P-channel field effect transistor (FET). Transistor 12 can be subject to two-dimensional channel-doping engineering and includes pocket or halo implant regions. Regions 22 and 24 can be planar, as shown in FIG. 1, or can be raised or elevated source and drain regions.

Transistor 12 can be substantially formed by conventional semiconductor processing techniques to form gate structure 18, including gate oxide or dielectric layer 34, source region 22, and drain region 24. Transistor 12 is provided between structures 58.

Extensions 23 and 25 are preferably ultra-shallow extensions (e.g., junction depth is less than 15–30 nm), which are thinner (i.e., shallower) than regions 17 and 19 of regions 22 and 24. Each of extensions 23 and 25 has a width of 40–80 nm (from left-to-right) and is integral with regions 22 and 24, respectively. Extensions 23 and 25 are disposed partially underneath a gate dielectric layer 34. Ultra-shallow extensions 23 and 25 help transistor 12 achieve substantial immunity to short-channel effects. Short-channel effects can degrade performance of transistor 12, as well as the manufacturability of the IC associated with transistor 12. Regions 22 and 24 and, hence, extensions 23 and 25, have a concentration of $10^{19}$ to $10^{20}$ dopants per cubic centimeter.

The transistor 12 includes a pair of low-k dielectric spacers (38). Low-k dielectric spacers (38) can be 1,000–2,000 Angstroms thick and 30–40 nm wide. Spacers 38 are preferably less than half of the width of extensions (23) and (25). The spacers (38) can be manufactured from a variety of low-k materials.

A silicide layer 70 is formed over drain region 24 and source region 22 of transistor 12. A portion 60 of silicide layer 70 is provided over source region 22, and a portion 62 of silicide layer 70 is provided over drain region 24. Portions 60 and 62 are preferably 100–200 Angstrom thick layers of titanium silicide (TiSi2), nickel silicide (NiSi2), cobalt silicide (CoSi2), or other conductive materials. Seventy percent (70–140 Angstrom) of portions 60 and 62 extend below top surface 39 of substrate 14.

In the '748 patent, the use of spacers 38 manufactured from low-k material advantageously reduces the gate-edge fringing capacitance associated at transistor 12 (especially transistor 12, which utilizes a high-k gate dielectric layer 34. Spacers 38 preferably have a k value of less than 2.0. The low-k material around the edges of gate structure 18 suppresses gate-edge fringing field effects so high-k gate dielectric layer 34 can be utilized with transistor 12. Thus, spacers 38 advantageously reduce overlap capacitance resulting from the gate-edge fringing electrical fields, thereby benefiting the speed of the transistor. Additionally, spacers 38 significantly improve sub-threshold voltage characteristics and low-voltage control of ultra-thin transistors, such as, transistor 12.

In the '748 patent, the low-k materials (k less than 3.0, preferably less than 2.0) can be created from vapor deposition and spin-on coating techniques. For example, vapor deposition of parylene and polynapthalene families of polymers and polytetrafluoroethylene (PTFE) can be utilized to form low-k materials. Alternatively, plasma enhanced chemical vapor deposition (PECVD), high density plasma CVD of fluorinated SiO2 glass, and amorphous C:F can form the low-k dielectric material. Air-gap formation and plasma polymerization of pentafluorostyrene and pulse plasma polymerization of PTFE can also be utilized. Additionally, materials can be deposited by spin coating; spin coating materials include organic polymers (fluorinated or non-fluorinated), inorganic polymers (nonporous), inorganic-organic hybrids, or porous materials (xerogels or aerogels).

In the application of reduced dielectric constant spacers, it is not generally possible to use porous materials ab initio due to attack of the underlying film in the pores. That is to say, the pores as deposited provide openings from which the plasma chemistry may attack the underlying material during the spacer reactive ion etch (RIE).

SUMMARY OF INVENTION

It is an aspect of the present invention to provide an improved technique for forming high speed logic gates for semiconductor devices.

It is another aspect of the present invention to provide an improved technique for reducing parasitic capacitance be replacing current spacer materials (e.g., oxide and silicon nitride) with low-k (lower dielectric constant than that of oxide or nitride), and to provide the spacer materials with pores to further reduce their dielectric constant, without jeopardizing the underlying gate dielectric layer.

According to the invention, an integrated circuit (IC) comprises an FET transistor having a gate disposed between a source and a drain; a gate dielectric layer disposed underneath the gate; and a spacer on a side of the gate. The gate dielectric layer is oxide and the spacer has a reduced dielectric constant (k). The reduced dielectric constant (k)

may be less than 3.85, or it may be less than 7.0 (~nitride), but greater than 3.85 (~oxide). Preferably, the spacer comprises a material which can be etched selectively to the gate dielectric layer. The spacer may be porous, and a thin layer is deposited on the porous spacer to prevent moisture absorption. The spacer may comprise a material selected from the group consisting of Black Diamond, Coral, TERA and Blok type materials.

According to the invention, pores may be formed in the spacer material by exposing the spacers to an oxygen plasma. In the case of spacers comprising an organic material, this removes the organic material.

In the present invention, reduced dielectric constant materials having a dielectric constant higher than oxide (>3.85) may be preferred to provide selectivity to gate oxide during subsequent contact etches, or even follow-on spacer structures. Also, in cases where 2 or 3 spacers are concurrently used, the ability to etch and strip these selective to one another is beneficial.

The present invention advantageously utilizes reduced dielectric constant materials that are inorganic in nature, such as spin-on glass (SOG), fluorinated silicon glass (FSG) and, particularly, methyl-doped porous silica which is referred to by practitioners of the art as black diamond, or BD. About 36% of a BD layers volume is in the form of pores having a diameter between about 8 and 24 Angstroms.

The present invention advantageously utilizes CVD (and PECVD) materials comprising an organic component. These materials which can readily be deposited without pores, and later caused to have pores.

In many spacer applications silicon nitride is typically used to provide selectivity to the contact dielectric (e.g. silicon dioxide), in spite of its higher dielectric constant. According to the invention, any material that offers selectivity to silicon dioxide with a dielectric constant less than that of silicon nitride is advantageous. For example:

TERA™, a silicon carbide type of material with k=5.0 developed by IBM.

Blok™, a silicon carbide type material with k=5.0 sold by AMAT Corp.

In an embodiment of the invention, pores are formed in situ during the spacer etch process. In particular, it is possible to remove the organic component of composite low-k materials (such as CORAL™, or Black Diamond™) during the spacer etch, resulting in a much lower effective dielectric constant. It is undesirable to have porosity generated ab initio due to exposure and subsequent damage of the gate dielectric by the spacer etch.

In an embodiment of the invention, these pores are formed in situ during the spacer etch process. In particular, it is possible to remove the organic component of composite low-k materials (such as CORAL™, or Black Diamond™) during the spacer etch, resulting in a much lower effective dielectric constant.

In Coral™, for example, the organic component is a methyl group, silicon dioxide lattice with many of the oxygen atoms replace wtih methyl group. CVD organic coral or BD, use an oxygen plasma treatment to make it porous.

After O2 plasma, the sidewall spacer material will have pores, usually (typically) ranging in size from 0.1 to 10 nanometers. The density of the pores, in other word how much of the material is pores versus the overall volume of the material, is typically approximately 20%–75% pores.

Distinguishing over the '748 patent.

The '748 patent discusses providing a plurality of low-k dielectric spacers (38) on the gate electrode 18. The spacers 38 are formed from a low-k dielectric material, as follows. A conformal layer of low-k dielectric material is provided over transistor 12. Preferably, the conformal layer is deposited by CVD over gate structure 18 and selectively etched to leave spacers 38 abutting the sides of gate structure 18. Alternatively, spacers 38 can be deposited in a spin-on technique or other process. Preferably, the low-k dielectric conformal layer is Xerogel (e.g., porous SiO2) material, is 200–250 nm thick, and is etched by anisotropic plasma dry-etch.

The '748 patent discusses providing an insulative layer 46 of oxide material over the spacer, the gate structure, and the silicide layer. The insulative layer 46 is preferably a thick silicon dioxide layer deposited in a tetraorthosilicate (TEOS) process at a low temperature (e.g., less than 400 degrees C.). Insulative layer 46 is initially 500–1000 nm thick. Layer 46 is etched to form vias 50 and 52 for contacts and local interconnects. Vias 50 and 52 expose portions 60 and 62, respectively. A conventional CMOS process can be utilized to form contacts and interconnects for transistor 12 and otherwise complete fabrication of portion 10.

The '748 patent is directed to a high-k gate dielectric integration scheme. The present invention is not limited to specify regular gate oxide or high-k dielectric. In the '748 patent, a value for k is specified which is less than 2. The present invention includes all the materials with k value less than that of nitride (which is about 7). The '748 patent further specifies low-k materials as porous silicon dioxide. The present invention is directed to low-k materials such as CORAL, Black Diamond, SiLK, TERA, Blok, or similar materials which has lower dielectric constant than common used silicon nitride.

The '748 patent provides for a low-k spacer material only when a high-k gate dielectric is used. This application is relatively trivial, since the low-k materials chosen are extremely soft relative to the inert gate dielectrics. This prevents any issues with punch through. The present invention includes materials which are compatible with standard gate dielectrics, and which utilize standard silicon based processing techniques.

The high-k gate dielectric of the '748 patent is inherently relatively thick, such as 50 Angstroms, and incorporates a metal oxide, so it is relatively inert. It is not silicon based, and inherently provides high selectivity to an oxide spacer etch. The present invention is suitable for conventional gate dielectrics, including thin gate oxides having a thickness of 9 Angstroms.

Whereas the '748 patent specifies high-k gate dielectric, and a low-k spacer (silicon dioxide) which can be etched selectively to the gate dielectric, the present invention can advantageously be used with a normal or low-k dielectric constant gate dielectric.

The '748 patent includes porous low-k silicon dioxide, deposited ab initio. This is generally unacceptable and, in particular, cannot be made compatible with standard gate dielectrics due to attack of the gate oxide by the spacer etch through the pores. The present invention provides a method for achieving porosity during or subsequent to the spacer etch process, and prevents attack of the gate dielectric. In the present invention, the oxygen plasma used to achieve porosity will not damage a normal silicon oxide gate isolation layer.

The '748 patent is directed to low-k spacer materials with dielectric constants less than 3. The present invention can advantageously utilize materials with dielectric constants less than 7, while allowing for selectivity between the spacer material and the contact dielectric.

BRIEF DESCRIPTION OF DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

DETAILED DESCRIPTION

Figure 1:
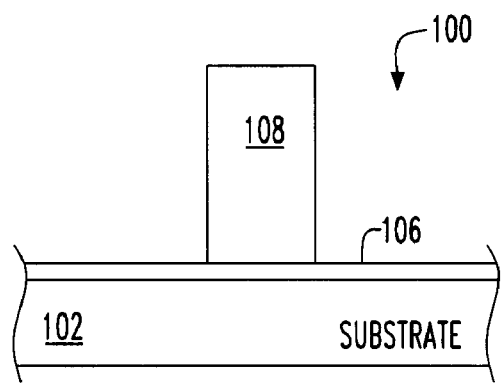
FIGS. 1–4 are cross-sectional views illustrating a sequence of steps (process flow) for a semiconductor device being processed, according to the invention.

In the description that follows, numerous details are set forth in order to provide a thorough understanding of the present invention. It will be appreciated by those skilled in the art that variations of these specific details are possible while still achieving the results of the present invention. Well-known processing steps are generally not described in detail in order to avoid unnecessarily obfuscating the description of the present invention.

Materials (e.g., silicon dioxide) may be referred to by their formal and/or common names, as well as by their chemical formula. Regarding chemical formulas, numbers may be presented in normal font rather than as subscripts. For example, silicon dioxide may be referred simply as "oxide", chemical formula SiO2.

In the description that follows, exemplary dimensions may be presented for an illustrative embodiment of the invention. The dimensions should not necessarily be interpreted as limiting. They are generally included to provide a sense of proportion. Generally speaking, it is the relationship between various elements, where they are located, their contrasting compositions, and sometimes their relative sizes that is of significance.

In the drawings accompanying the description that follows, often both reference numerals and legends (labels, text descriptions) will be used to identify elements. If legends are provided, they are intended merely as an aid to the reader, and should not in any way be interpreted as limiting.

FIG. 1 shows a small portion of an integrated circuit (IC) 100 comprising a semiconductor substrate (wafer) 102. A gate dielectric (isolation) layer 106 is disposed atop the wafer 102. The gate dielectric layer 106 is typically silicon dioxide (SiO2) or a combination silicon oxynitride (SiON), and suitably has a thickness of approximately 9–12 Angstroms.

A gate electrode (gate) 108 is disposed atop the gate dielectric layer 106. The gate 108 typically comprises polysilicon (poly). The gate 108 can be made using soft mask (resist) or a dielectric (oxide) hard mask. The gate 108 may have an exemplary width of approximately 30 to 60 nm and an exemplary height of of approximately 80 to 150 nm. This is the first step ("gate formation") of the overall process described herein. The present invention advantageously utilizes standard gate formation and isolation techniques. The gate dielectric layer 106 is disposed underneath the gate 108.

Figure 2:
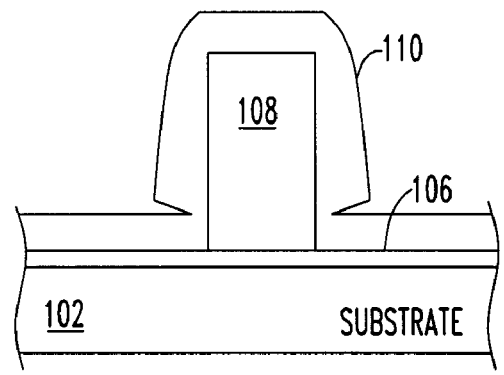

FIG. 2 illustrates a next step ("spacer deposition") in the process, and shows the gate 108 surrounded with low-k or medium-k (collectively, "reduced dielectric constant") materials 110 which are deposited as a film using any suitable spacer deposition method, such as CVD or spin-on.

The reduced dielectric constant material 110 comprises any of the materials specified above. Of particular interest are:

PECVD materials such as CORAL and Black Diamond, or TERA and BloK. These materials can easily be made porous, after spacer etching, as discussed below, resulting in a dielectric constant of less than 2.

Spin-On materials such as SiLK and JSR or similar material which has lower dielectric constant than commonly used silicon nitride.

It is advantageous that the dielectric material 110 can be made porous, as discussed below. In this regard, the spin-on materials are generally more difficult to make porous, because typically the entire material is organic. PECVD materials can withstand higher temperatures which is important in the context of a subsequent spike anneal process which can expose the dielectric material to temperatures of 1100 degrees C. Spin-on materials will generally reflow at such elevated temperatures.

This reduced dielectric constant material 110 will form the spacers (112 and 114, below). The thickness of the spacer, hence the thickness of the reduced dielectric constant material will be determined by source and drain implant geometry. For example, the reduced dielectric constant material 110 may be deposited to a thickness of 50 nm, and post etch have a spacer thickness of 35 40 nm. The exact dimensions will depend on the desired device characteristics.

The thickness of the spacer is limited by the pitch of the gates and how many spacers are put in place. In contrast with the '748 patent, the spacers of the present invention can be made thicker, since the materials are generally etch resistant to silicon dioxide (e.g., gate oxide). That is to say, the width of the spacer may actually be larger than the distance between the gate and a silicide layer, although it may also be shorter.

The reduced dielectric constant material 110 covers the top (as viewed) of the gate electrode 108, the two (left and right, as viewed) sides of the gate electrode 108, and the top surface of the gate oxide layer 106.

Figure 3:
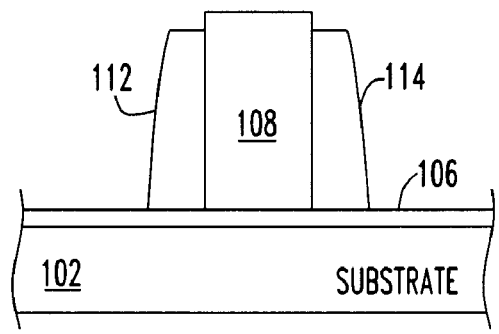

FIG. 3 illustrates a next step ("etch") in the process. The reduced dielectric constant material 110 is etched with a chlorine (Cl2) or fluorine (F2) plasma. In this step, the reduced dielectric constant material 110 is removed from atop the gate 108, and from the surface of the gate dielectric layer 106, but substantially remains on the sides of the gate 108. The gate oxide 106 can act as an etch stop.

This etch step is preferably anisotropic (essentially unidirectional), etching from top down (as viewed) with little effect in the lateral (as viewed) direction. The greater the degree of isotropy (omni-directional) etch used, the greater the initial thickness of the material 110 would have to be to account for significant thinning of the material 110 on the sides of the gate electrode 108. If too isotropic the spacer etch would remove all of the material and a spacer would not form.

The resulting structure is a gate 108 with spacers 112 and 114 on both sides of the gate 108. The spacers 112, and 114 have a thickness of approximately 20 nm, and extend to the height of the gate 108 which is exposed in this etch step. For non-porous reduced dielectric constant spacers, the resulting gate structure is complete.

For example, with a standard oxide gate dielectric, the spacers can be any of the medium-k dielectric materials listed above, providing good selectivity during etch.

Preferably, the spacers are made porous. This is generally done by exposing the spacers to an oxygen plasma which will remove the organic materials (e.g., carbon, nitrogen). For example, In the case of Si—O—C—N type of low-k materials (e.g., Coral, Black Diamond, TERA, Blok) 110 the carbon (C) and nitrogen (N) atom may be removed from the film during the etching. Oxygen atoms are able to extract nearly all of the carbon and nitrogen from these materials with an oxygen (O2) plasma, leaving a stoichiometric SiO2 layer. It is expected that this SiO2 layer will be porous, which should provide even a lower dielectric constant. By forming pores during the spacer etch, the underlying layers are not subject to attack during the spacer etch as would occur if material was porous after deposition (ab initio).

Figure 4:
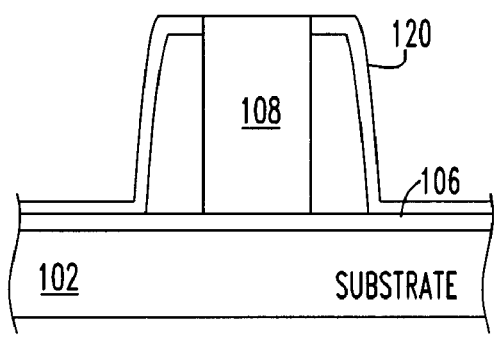

FIG. 4 illustrates a next step ("deposition") in the process. After spacer etch, a thin layer of material 120 is deposited to cover the porous film 112, 114. The material 120 is suitably oxide. The deposition process is suitably PECVD. The thin oxide layer 120 suitably has a thickness of less than 5 nm, such as approximately 1 to 2 nm. Any material 120 which can act as a moisture barrier may be used to seal the porous film 112, 114. This would include materials such as amorphous silicon or nitride.

The purpose of this thin layer of oxide 120 is to prevent moisture absorption by the low-k (or medium-k) porous spacers 112, 114. This step can utilize the same platform for etch chamber and DVD chamber as in the etch step, so that the low-k (or medium-k) film will be kept in vacuum between etch and deposition processes. This deposition step would not be required for non-porous applications of reduced dielectric constant (e.g., medium-k) materials.

Figure 5:
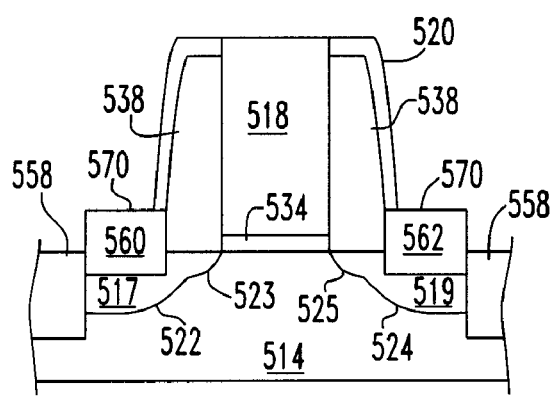
FIG. 5 is a cross-sectional view of an exemplary transistor fabricated in accordance with the present invention.

FIG. 5 illustrates an exemplary MOSFET formed in accordance with the present invention. It is presented as being structurally (geometrically) similar to the MOSFET described in the aforementioned '748 patent. Hence, similar numbers are used.

A transistor 512 is disposed on a semiconductor substrate 514 (compare 102), such as, a single crystal silicon wafer. Transistor 512 is part of a portion of an integrated circuit (IC) manufactured on a wafer (such as, a silicon wafer). Substrate 514 can be any semiconductor material, including gallium arsenide (GaAs), silicon (Si), germanium (Ge), or other material. Alternatively, substrate 514 can be a thin-film layer that is part of a silicon-on-insulator substrate.

Transistor 512 includes a gate stack or structure 518 (compare 108), a source region 522, and a drain region 524. Source region 522 and drain region 524 also include a source extension 523 and a drain extension 525, respectively. In the exemplary embodiment, source region 522 and drain region 524 have deep contact regions 517 and 519, respectively.

Transistor 512 can be an N-channel or a P-channel field effect transistor (FET). Transistor 512 can be subject to two-dimensional channel-doping engineering and includes pocket or halo implant regions. Regions 522 and 524 can be planar, as shown in FIG. 5, or can be raised or elevated source and drain regions.

The transistor 512 includes a pair of low-k dielectric spacers 538 (compare 112 and 114). The low-k dielectric spacers 538 can be 1,000–2,000 Angstroms thick and 30–40 nm wide. The low-k spacers 538 are preferably less than half of the width of extensions 523 and 525. The low-k spacers 538 can be manufactured from a variety of low-k materials, as described above.

A silicide layer 570 is formed over drain region 524 and source region 522 of transistor 512. A portion 560 of silicide layer 570 is provided over source region 522, and a portion 562 of silicide layer 570 is provided over drain region 524.

Transistor 512 can be substantially formed by conventional semiconductor processing techniques to form gate structure 18, including gate oxide or dielectric layer 534, source region 522, and drain region 524. Transistor 512 is provided between structures 558.

The example of FIG. 5 is shown using a porous spacer 538 which is covered by a thin oxide layer 520 (compare 120, FIG. 4).

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

The invention claimed is:

1. A method of forming a spacer for a gate electrode of a transistor comprising the steps:
   depositing a dielectric material;
   etching the dielectric material to form a spacer;
   forming pores in the dielectric material; and
   depositing a thin layer over the porous dielectric material;
   wherein:
   the spacer is made porous by exposing the spacers to an oxygen plasma.

2. The method, according to claim 1, wherein the thin layer comprises oxide.

3. The method, according to claim 1, wherein the thin layer has a thickness of less than 5 nm.

4. The method, according to claim 1, wherein:
   the spacer comprises a Si—O—C—N type of low-k material.

5. The method, according to claim 1, wherein:
   the spacer has a reduced dielectric constant (k); and
   the reduced dielectric constant (k) is less than 3.85.

6. The method, according to claim 1, wherein the thin layer comprises a material selected from the group consisting of oxide, amorphous silicon and nitride.

7. A method of forming a spacer for a gate electrode of a transistor comprising the steps:
   depositing a dielectric material;
   etching the dielectric material to form a spacer;
   forming pores in the dielectric material; and
   depositing a thin layer over the porous dielectric material;
   wherein:
   the spacer comprises organic material; and
   the spacer is made porous by removing the organic material.

8. The method, according to claim 7, wherein:
   the spacer comprises a Si—O—C—N type of low-k material.

9. The method, according to claim 7, wherein:
   the spacer has a reduced dielectric constant (k); and
   the reduced dielectric constant (k) is less than 3.85.

10. The method, according to claim 7, wherein the thin layer comprises a material selected from the group consisting of oxide, amorphous silicon and nitride.

11. The method, according to claim 7, wherein the thin layer has a thickness of less than 5 nm.

12. A method of forming a spacer for a gate electrode of a transistor comprising the steps:
depositing a dielectric material;
etching the dielectric material to form a sparer;
forming pores in the dielectric material; and
depositing a thin layer over the porous dielectric material;
wherein:
the pores are formed during the spacer etch, rather than during deposition of the dielectric material.

13. The method, according to claim 12, wherein:
the spacer comprises a Si—O—C—N type of low-k material.

14. The method, according to claim 12, wherein:
the spacer has a reduced dielectric constant (k); and
the reduced dielectric constant (k) is less than 3.85.

15. The method, according to claim 12, wherein the thin layer comprises a material selected from the group consisting of oxide, amorphous silicon and nitride.

16. The method, according to claim 12, wherein the thin layer has a thickness of less than 5 nm.

17. A method of forming a spacer for a gate electrode of a transistor comprising the steps:
depositing a dielectric material;
etching the dielectric material to form a spacer;
forming pores in the dielectric material; and
depositing a thin layer over the porous dielectric material;
wherein the spacer has a reduced dielectric constant (k);
wherein the reduced dielectric constant (k) is less than 7.0, but greater than 3.85.

18. The method, according to claim 17, wherein:
the spacer comprises a Si—O—C—N type of low-k material.

19. The method, according to claim 17, wherein the thin layer comprises a material selected from the group consisting of oxide, amorphous silicon and nitride.

20. The method, according to claim 17, wherein the thin layer comprises a material selected from the group consisting of oxide, amorphous silicon and nitride.

* * * * *